(12) United States Patent
Krzyzanowski et al.

(10) Patent No.: US 7,129,855 B2
(45) Date of Patent: Oct. 31, 2006

(54) DEVICE CONTROL SYSTEM, METHOD, AND APPARATUS

(75) Inventors: Paul Krzyzanowski, Fanwood, NJ (US); Glenn Harter, Wellington, FL (US)

(73) Assignee: OpenPeak Inc., Boca Raton, FL (US)

( * ) Notice: Subject to any disclaimer, the term of this patent is extended or adjusted under 35 U.S.C. 154(b) by 0 days.

(21) Appl. No.: 10/783,017

(22) Filed: Feb. 23, 2004

(65) Prior Publication Data

US 2005/0068222 A1    Mar. 31, 2005

Related U.S. Application Data

(60) Provisional application No. 60/505,851, filed on Sep. 26, 2003.

(51) Int. Cl.
*G08C 19/00* (2006.01)
(52) U.S. Cl. .......................... 340/825.72; 340/825.69; 340/825.22; 340/5.61; 340/5.64; 340/5.74; 340/5.2; 340/5.1; 340/5.22; 340/5.27
(58) Field of Classification Search .......... 340/825.72, 340/825.69, 825.22, 5.61, 5.64, 825.49, 5.74, 340/5.2, 5.1, 5.22, 5.27; 348/734; 707/6, 707/4, 5
See application file for complete search history.

(56) References Cited

U.S. PATENT DOCUMENTS

| | | | |
|---|---|---|---|
| 5,410,326 A * | 4/1995 | Goldstein .................... | 348/734 |
| 5,537,463 A | 7/1996 | Escobosa et al. | |
| 5,552,917 A | 9/1996 | Darbee et al. | |
| 5,953,144 A | 9/1999 | Darbee et al. | |
| 6,267,678 B1 * | 7/2001 | Kubo et al. .................... | 463/44 |
| 6,563,430 B1 * | 5/2003 | Kemink et al. ........ | 340/825.49 |
| 6,665,020 B1 * | 12/2003 | Stahl et al. .................. | 348/552 |
| 6,885,643 B1 * | 4/2005 | Teramoto et al. ........... | 370/252 |

OTHER PUBLICATIONS

"*Harmony Remote—Overview*", URL http://www.harmonyremote.com/product_overview.htm, downloaded from the World Wide Web on Feb. 9, 2004, 2 pages.
"*Harmony Remote—Features*", URL http://www.harmonyremote.com/product_features.htm, downloaded from the World Wide Web on Feb. 9, 2004, 2 pages.
"*Specifications for Harmony Remote*", URL http://www.harmonyremote.com/product_specifications.htm, downloaded from the World Wide Web on Feb. 9, 2004, 2 pages.

(Continued)

*Primary Examiner*—Brian Zimmerman
*Assistant Examiner*—Vernal Brown
(74) *Attorney, Agent, or Firm*—Sterne Kessler Goldstein & Fox PLLC

(57) ABSTRACT

A system, method and apparatus for controlling consumer electronic (CE) devices. A control unit obtains CE device command codes and "metadata" from an interactive, wirelessly accessible database. The control unit uses the metadata, which is data relating to the unique control behaviors of a CE device, to translate between a universal control command and one or more of the command codes associated with the CE device. A wireless access method is used to download the CE device metadata and command codes to a central server or to the control unit itself. The control unit provides an interface by which end users can provide feedback concerning downloaded metadata and command codes, such that erroneous data may be corrected or so that other users may determine whether the data is worth accessing.

49 Claims, 9 Drawing Sheets

OTHER PUBLICATIONS

"*Harmony Remote—Frequently Asked Questions*", URL http://www.harmonyremote.com/faq.htm, downloaded from the World Wide Web on Feb. 9, 2004, 2 pages.

"*Harmony Remote SST-659*", published at http://www.harmonyremote.com, downloaded from the World Wide Web on Feb. 9, 2004, 1 page.

"*Harmony Remote SST-748*", published at http://www.harmonyremote.com, downloaded from the World Wide Web on Feb. 9, 2004, 1 page.

"*Harmony Remote SST-768f*", published at http://www.harmonyremote.com, downloaded from the World Wide Web on Feb. 9, 2004, 1 page.

"*Harmony Remote SST-659 User Manual*", dated Oct. 16, 2003, published at http://www.harmonyremote.com, downloaded from the World Wide Web on Feb. 9, 2004, 20 pages.

"*Harmony Remote SST-768 User Manual*", dated Mar. 25, 2003, published at http://www.harmonyremote.com, downloaded from the World Wide Web on Feb. 9, 2004, 37 pages.

* cited by examiner

| RESULTS FOUND: SHARP AQUOS TELEVISION | | | |
|---|---|---|---|
| USER APPROVAL RATING | APPROVALS | DISAPPROVALS | DATE ENTERED |
| 98% | 196 | 4 | 4/24/2006 |
| 92% | 276 | 24 | 8/17/2005 |
| 40% | 4 | 6 | 6/13/2007 |
| 10% | 1 | 9 | 1/12/2006 |

APPROVE/DISAPPROVE EXISTING DATABASE ENTRY (800)

DID THIS DATABASE ENTRY SUCCESSFULLY CONTROL YOUR SHARP AQUOS TELEVISION?

◉ YES
○ NO      [SUBMIT]   [CANCEL]

FIG.8

SUBMIT NEW DATABASE ENTRY (900)

WOULD YOU LIKE TO SUBMIT YOUR CHANGES FOR THE SHARP AQUOS TELEVISION?

[YES]   [NO]

FIG.9

DEVICE CONTROL SYSTEM, METHOD, AND APPARATUS

CROSS-REFERENCE TO RELATED APPLICATIONS

This application claims the benefit of the filing date of U.S. provisional Application No. 60/505,851, filed Sep. 26, 2003, the entirety of which is incorporated by reference as if set forth fully herein.

BACKGROUND OF THE INVENTION

Field of the Invention

The present invention is generally directed to device control. In particular, the present invention relates to a system, method and apparatus for controlling consumer electronic devices.

BACKGROUND

The majority of consumer electronic (CE) devices currently available to end users are remotely controllable through handheld remote control units that transmit command codes via infra-red (1R) signals intelligible by the CE devices. Such CE devices may include, but are not limited to, televisions (TVs), digital video disc (DVD) players, personal video recorders (PVRs), compact disc (CD) players, and stereo receivers. Example command codes for controlling such devices include, but are not limited to, power on/off, channel select, channel up/down, and volume up/down.

The set of command codes required to control the basic functions of a CE device are typically stored in the firmware of the remote control unit. A command code corresponding to a certain CE device operation or function is converted by the remote control unit into IR signals that are transmitted to and received by the CE device. In turn, the CE device converts the received IR signals into a command code and then executes a function corresponding to the code.

The most basic remote control units (i.e., single device remote control units) store a single set of IR command codes that can only be used to control CE devices of a certain manufacturer and model type. The set of command codes is adapted to enable the unique feature set of the CE device type it is associated with. As a result, a set of command codes useful for controlling one CE device having a particular manufacturer/model type cannot be used to control another CE device having a different type.

So-called multi-device or "universal" remote control units attempt to address this limitation by storing multiple sets of IR command codes for different CE device types. These universal remote control units are typically pre-populated with a fixed, finite set of basic command codes for different device models or devices made by different manufacturers, wherein a code set can be selected by the user. Some universal remote control units are programmable to a certain extent to allow them to "learn" new codes. In others, additional IR command codes and updates can be uploaded to the remote control units from an IR command code database maintained in a location separate from the remote control unit. For example, the IR command code database may reside on the end user's personal computer (PC) and be accessed via a wired serial connection between the remote control unit and the PC. Alternatively, as disclosed in U.S. Pat. No. 5,537,463 to Escobosa et al., the IR command code database may reside on a remotely located computer that is accessible by phone line, in which case the remote control unit is required to download data via a separate or built-in modem. Still further, IR command codes may be learned by sampling the output of an existing remote control unit.

Although universal remote control units permit an end user to remotely control more than one type of CE device, the end user must still familiarize themselves with the control idiosyncrasies of each type of CE device to properly control each device using the remote control unit. For example, two televisions having a different manufacturer or model type may have control idiosyncrasies relating to setting input state or channel tuning. As a result, a different series of universal commands must be used for each television to achieve an identical function. Moreover, the user still must control the devices individually: the user must put the remote control in "VCR mode" or "TV mode" or "DVD mode" instead of having an integrated control that would, for example, turn on the VCR, TV, or DVD player. Any such combinations have to be programmed explicitly via macros on remote controls that support them. Thus, conventional universal remote control units do not provide true automated or programistic control of a variety of CE device types.

As noted above, conventional remote control schemes permit a user to upload IR command codes onto a remote control unit via a serial link from an IR code database stored on a PC. Such systems require the user to take his or her remote control unit to the room where the PC is located (which is often not the same room as where the controllable CE device is located), physically connect the remote control unit to the PC with a serial cable, use the PC user interface to download data from the PC, disconnect the serial link, and return the remote control unit to the room where the controllable CE device is located. Performing these steps can be time consuming and inconvenient for the user.

What is desired, then, is a system, method and apparatus for controlling CE devices that provides true automatic and programistic control of a variety of CE device types using a remote control unit employing a universal command set. Furthermore, the desired system, method and apparatus should permit a user to access necessary IR command codes without having to physically connect and disconnect the remote control unit to a PC.

BRIEF SUMMARY OF THE INVENTION

The invention disclosed herein relates generally to a system for controlling CE devices, and in particular, to a system for controlling CE devices that includes an interactive, wirelessly accessible database or library control codes and device "metadata." As will be described in more detail herein, an embodiment of the present invention utilizes CE device "metadata," which is data relating to the unique control behaviors of a particular CE device, to associate a universal remote control command with one or more command codes associated with the CE device. The use of CE device metadata in this manner permits for true automatic and programistic control of a variety of different CE device types.

The present invention also provides a wireless access method by which a remote control unit can download the CE device metadata and command codes from a centralized, wireless-accessible database to a central server (in a client/server environment) or to the remote control unit itself (in a serverless environment). The present invention further provides a means for end users to provide feedback concerning downloaded metadata and command codes, such that erroneous data may be corrected or so that other users may determine whether the data is worth accessing.

In particular, an embodiment of the present invention provides a method for controlling a CE device. In accordance with the method, metadata relating to unique control behaviors of the CE device is accessed. A universal command for controlling CE devices is associated with one or more command codes selected from a predefined set of command codes for the CE device, wherein the one or more command codes are selected based on the metadata. The universal command is executed in response to user input, or in response to reaching some programmed time (e.g., turn off all devices at 11:00 PM), or triggering action or event (e.g., when TV is powered on), wherein the execution includes transmitting the one or more command codes to the CE device. The metadata and the set of command codes may be stored in a database that is accessed via a wireless network connection. User input related to one or more errors in the metadata or the set of command codes or related to approval or disapproval of the same may be transmitted to a host that maintains the database.

In another embodiment of the present invention, an apparatus for controlling a CE device is provided. The apparatus includes a network interface, such as an IEEE 802.11 wireless interface, an IR transmitter, a user interface, and control logic coupled to the network interface, the IR transmitter, and the user interface. The control logic is adapted to access metadata related to unique control behaviors of the CE device via the network interface, to associate a universal command for controlling CE devices with one or more command codes selected from a predefined set of command codes for the CE device, wherein the one or more command codes are selected based on the metadata, and to execute the universal command in response to user input, wherein executing the universal command includes transmitting the one or more command codes to the CE device via the IR transmitter. The control logic may be adapted to access a database that stores the metadata and the set of command codes via the network interface. The apparatus may further include a database user interface adapted to receive user input related to one or more errors in the metadata or the set of command codes or related to approval or disapproval of the same. The control logic may be further adapted to transmit the user input to a host that maintains the database.

In another embodiment of the present invention, a system for device control is provided. The system includes a CE device, a server that includes a database that stores metadata related to unique control behaviors of the CE device, and a remote control unit communicatively connected to the CE device via an IR link and to the server via a network. The remote control unit is adapted to receive the metadata from the server, to associate a universal command for controlling CE devices with one or more command codes selected from a predefined set of command codes for the CE device, wherein the one or more command codes are selected based on the metadata, and to execute the universal command in response to user input, wherein executing the universal command includes transmitting the one or more command codes to the CE device. The remote control unit may comprise a personal digital assistant (PDA) or web pad that is further adapted to establish a wireless connection with the network in accordance with an IEEE 802.11 protocol. The remote control unit may be further adapted to receive user input related to one or more errors in the metadata or the set of command codes or related to approval or disapproval of the same and to transmit the user input to the server.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 5:
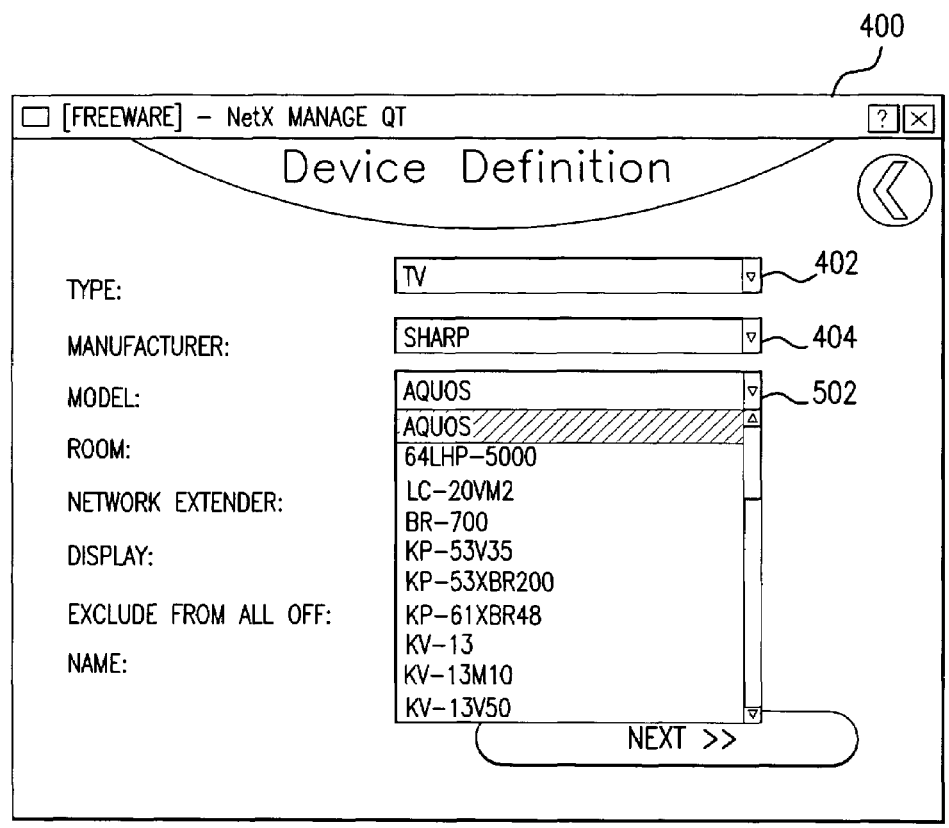

FIG. 5 further illustrates an example GUI for accessing CE device metadata and/or IR command codes in accordance with an embodiment of the present invention.

FIG. 6 illustrates an additional example GUI for accessing CE device metadata and/or IR command codes in accordance with an embodiment of the present invention.

Figure 7:
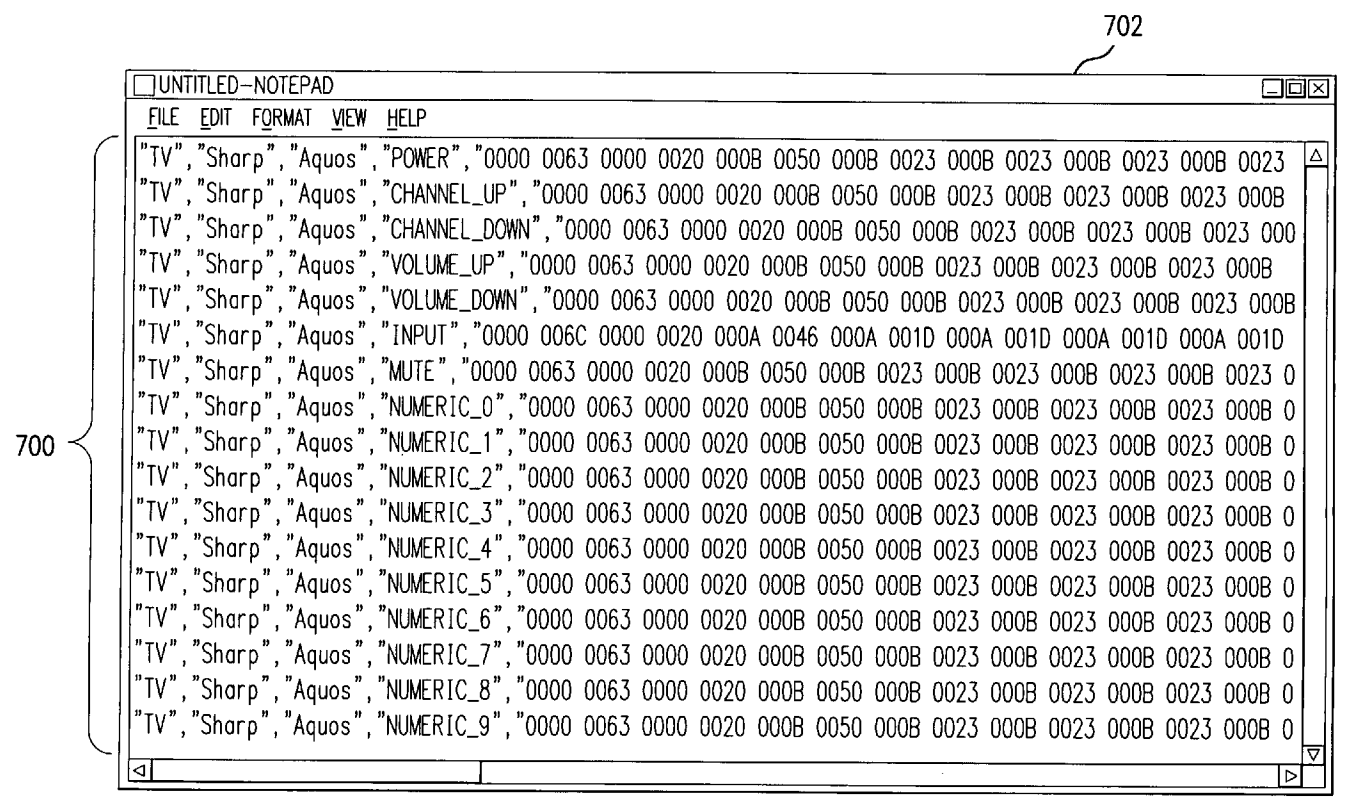

FIG. 7 depicts IR command code data for a CE device that is accessed by a remote control unit in accordance with an embodiment of the present invention.

FIG. 8 illustrates an example GUI for providing user input relating to approval or disapproval of CE device metadata and/or IR command codes in accordance with an embodiment of the present invention.

FIG. 9 illustrates an example GUI for providing user input relating to the correction of one or more errors in CE device metadata and/or IR command codes in accordance with an embodiment of the present invention.

Figure 10:
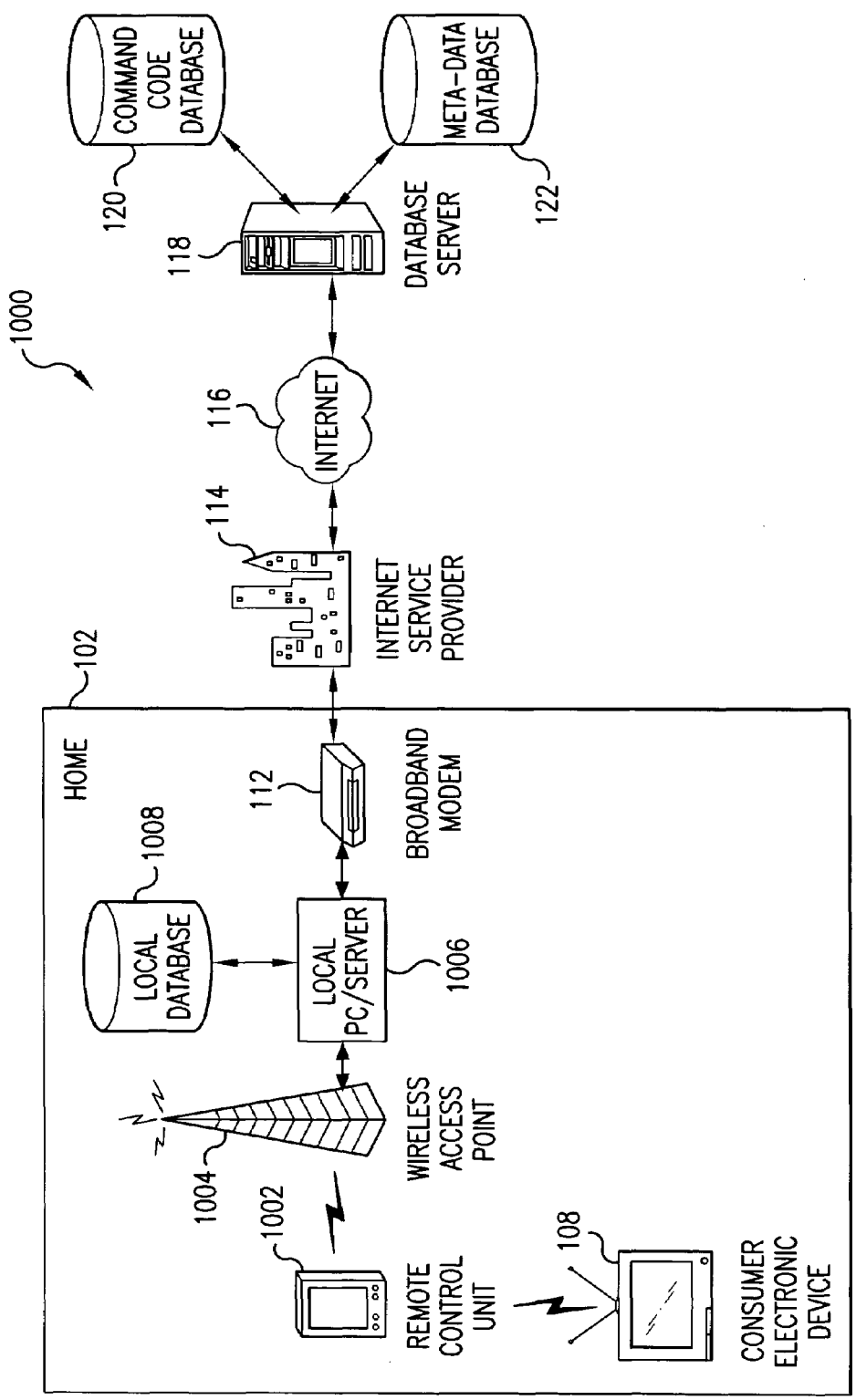

FIG. 10 depicts the elements of an alternate device control system in accordance with an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

Figure 1:
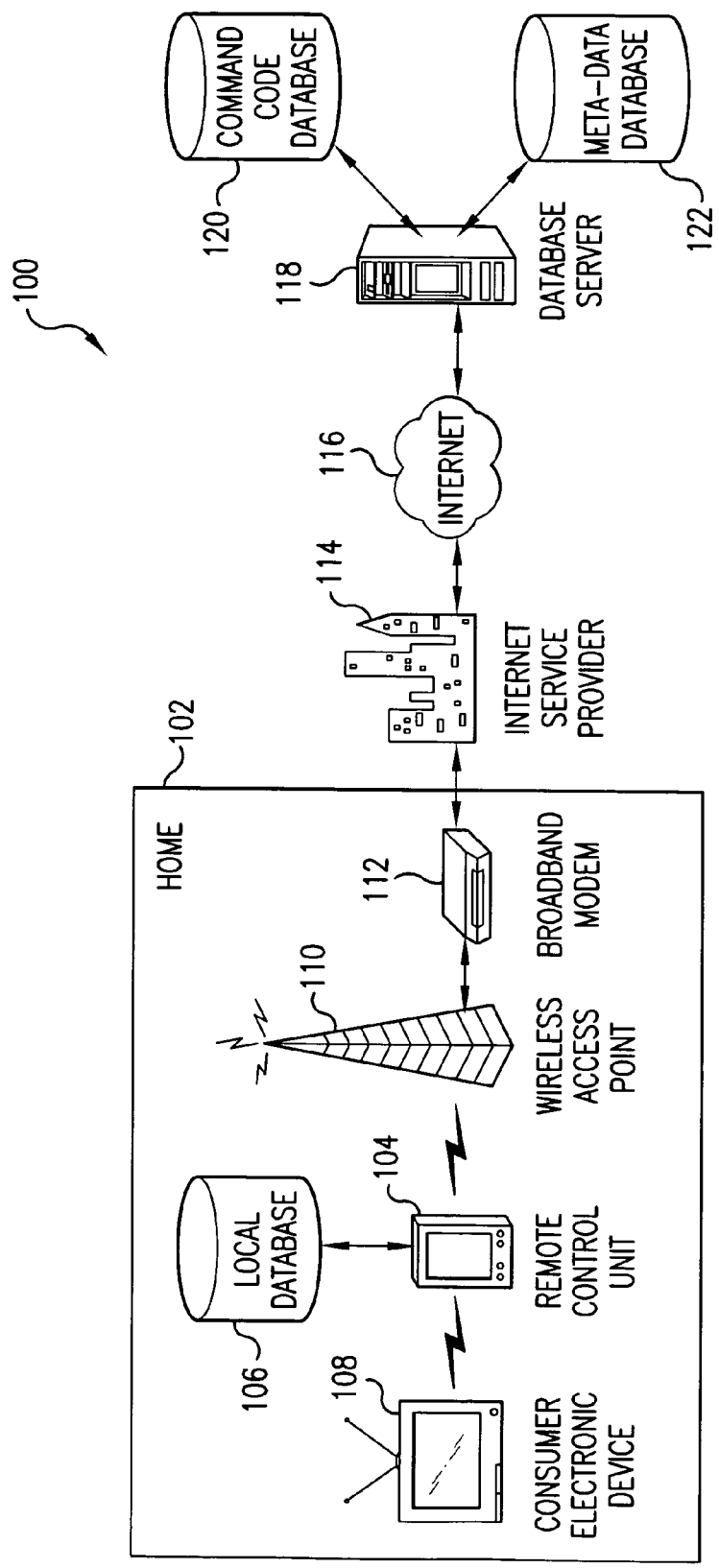
FIG. 1 depicts the elements of a device control system in accordance with an embodiment of the present invention.

A. Device Control System In Accordance with an Embodiment of the Present Invention FIG. 1 depicts an example device control system 100 in accordance with an embodiment of the present invention. As shown in FIG. 1, system 100 includes components internal to a home 102, including a remote control unit 104 and a consumer electronic (CE) device 108. Remote control unit 104 permits a user to execute a basic set of universal commands for controlling a variety of CE devices each having a different manufacturer and/or model type, including CE device 108. CE device 108 may comprise any type of CE device including, but not limited to, conventional CE devices such as a television, video cassette recorder (VCR), DVD player, stereo receiver, electronic thermostat, lamp, video camera, or the like. These examples are not intended to be limiting, however, and CE device 108 may comprise other electronic devices not listed above.

Remote control unit 104 executes a universal command by transmitting to CE device 108 one or more command codes selected from a set of command codes associated with the CE device. In the embodiment depicted in FIG. 1, the set of command codes associated with CE device 108 comprise IR command codes, which are transmitted from remote control unit 104 to CE device 108 via a wireless communication link, such as a one or two-way infra-red (1R) communication link. The use of IR communication for remote control of CE devices is well known in the art. However, other wireless communication protocols such as IEEE 802.11 or Bluetooth® and be used.

As will be described in more detail herein, the selection of the appropriate command codes for executing a particular universal command in accordance with an embodiment of the present invention is based, in part, on analysis of metadata for CE device 108. Metadata refers to data that pertains to the unique control behaviors of a particular CE device, such as CE device 108. In order to select the appropriate command codes, remote control unit 104 must have access to a set of command codes for controlling CE device 108 as well as metadata for the device.

In system 100, the set of command codes and metadata for CE device 108 is accessed by remote control unit 104 via a connection to remote databases 120 and 122, which comprise a command code database and a metadata database, respectively. Although two databases 120 and 122 are depicted in system 100 for the sake of clarity, persons skilled in the relevant art(s) will readily appreciate that command codes and metadata may be stored in a single database as well. A database server 118 handles all accesses to remote databases 120 and 122. Once remote control unit 104 has obtained the necessary command codes and metadata from remote databases 120 and 122, it stores this information in a local database 106, which preferably resides in memory internal to remote control unit 104.

In the embodiment depicted in FIG. 1, remote control unit 104 accesses remote databases 120 and 122 via a broadband connection to the Internet 116, access to which is provided by Internet Service Provider (ISP) 114. Access via wide area networks other than the Internet is also encompassed by the present invention.

The connection to ISP 114 is implemented in home 102 using a broadband modem 112, although other means for providing access to ISP 114 are well known to persons skilled in the relevant art(s). In accordance with an embodiment of the present invention, remote control unit 104 is wirelessly connected to broadband modem 112, and hence Internet 116, via a wireless access point 110. In an embodiment, wireless communication between remote control unit 104 and wireless access point 110 is achieved in accordance with the IEEE 802.11b communication protocol, or any of the other IEEE 802.11 protocols, including but not limited to the 802.11, 802.11a, 802.11b or 802.11 g protocols. By providing wireless access in this manner, an embodiment of the present invention permits a user to directly access the necessary command codes and metadata efficiently from any room or area in the home 102. For example, the user may access the necessary command codes and metadata while residing in the room in which CE device 108 is located. Nevertheless, a wired connection can also be used to connect to the broadband modem 112.

Figure 2:
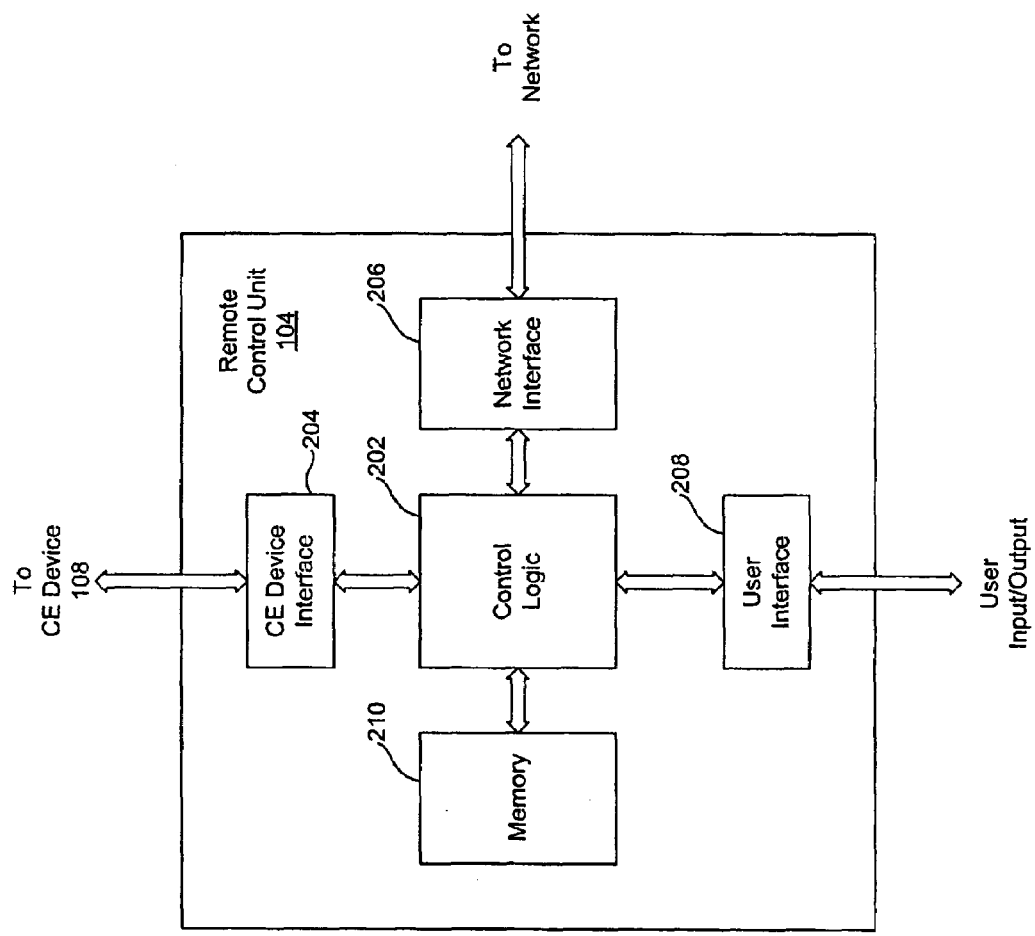
FIG. 2 is a depiction of the functional elements of an example remote control unit in accordance with an embodiment of the present invention.

FIG. 2 depicts the functional elements of an example remote control unit 104 in accordance with an embodiment of the present invention. Remote control unit 104 may comprise a personal digital assistant (PDA) or web-pad, although the invention is not so limited. As shown in FIG. 2, remote control unit 104 includes a user interface 208 for receiving user input and providing information to a user, a network interface 206 for providing access to a network, and a CE device interface 204 for transmitting information to, and optionally receiving information from, a CE device. In an embodiment, user interface 208 comprises a graphical user interface (GUI) that receives user input via a touch-sensitive display, network interface 206 comprises a plug-in or built-in WiFI network card that includes an IEEE 802.11b-compliant transceiver, and CE device interface 204 comprises a one-way IR transmitter or, alternately, a two-way IR transceiver.

In an alternate embodiment, CE device interface 204 comprises a WiFi transmitter or transceiver adapted for communication in accordance with an IEEE 802.11 protocol. Where the CE device interface 204 is implemented in this fashion, and the CE device to be controlled is adapted to perform IR communication only, an intermediate device is necessary for converting between 802.11 and IR communication protocols. A bridge device that facilitates such communication between an 802.11-compliant control device and a CE device that communicates using an IR link is described in commonly-owned co-pending U.S. patent application Ser. No. 10/387,590 to Krzyzanowski et al., filed Mar. 14, 2003 and entitled "Legacy Device Bridge for Residential or Non-Residential Networks," the entirety of which is incorporated by reference as if fully set forth herein.

As shown in FIG. 2, remote control unit 104 further includes control logic 202, which is communicatively coupled to user interface 208, network interface 206, and CE device interface 204. Control logic 202 is adapted to execute features of the present invention as will be described in more detail herein, including but not limited to processing user input received from user interface 208, accessing a set of command codes and metadata for a particular CE device via network interface 206, and transmitting command codes to a CE device via CE device interface 204. As will be appreciated by persons skilled in the relevant art(s) based on the teachings provided herein, control logic 202 may be readily implemented in hardware, software, or as combination of hardware and software.

Remote control unit 104 also includes a memory 210 that is communicatively coupled to control logic 202. Memory 210 may be used to store local database 106, described above in reference to FIG. 1. Accordingly, memory 210 may be used to store a set of command codes and metadata for a variety of CE devices, including CE device 108.

Figure 3:
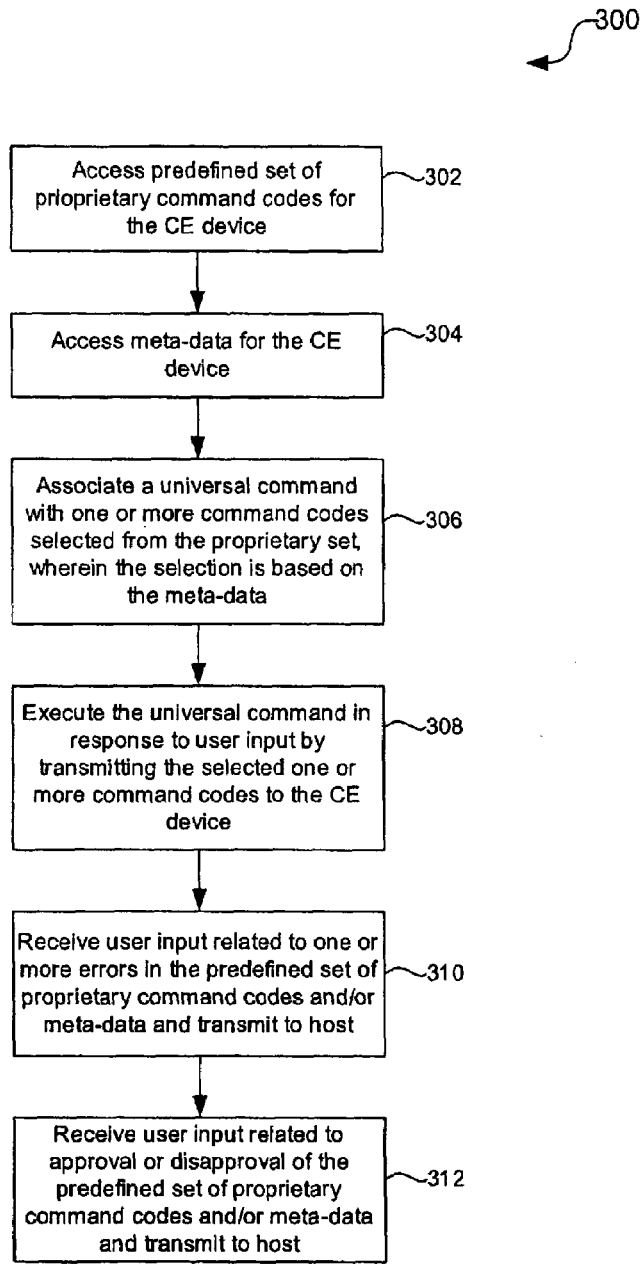
FIG. 3 illustrates a flowchart of a device control method in accordance with an embodiment of the present invention.

B. Device Control Method in Accordance with an Embodiment of the Present Invention FIG. 3 illustrates a flowchart 300 of a device control method in accordance with an embodiment of the present invention. The invention, however, is not limited to the description provided by the flowchart 300. Rather, it will be apparent to persons skilled in the relevant art(s) from the teachings provided herein that other functional flows are within the scope and spirit of the present invention. Flowchart 300 will be described with continued reference to example system 100 described above in reference to FIG. 1. The invention, however, is not limited to this embodiment.

The method of flowchart 300 begins at steps 302 and 304 in which a user utilizes remote control unit 104 to access a predefined set of command codes and metadata for a CE device. For example, in accordance with an embodiment of the present invention, the user employs remote control unit 104 to establish a wireless connection with database server 118 and download a predefined set of command codes and metadata for CE device 108. In an embodiment, these steps are performed serially—in other words, the command codes are accessed before the metadata, or vice versa. In an alternate embodiment, however, these steps are performed concurrently—for example, the command codes and metadata may be downloaded as part of the same file.

At step 306, remote control unit 104 associates a universal command for controlling a CE device with one or more command codes selected from the set of command codes accessed in step 302. The association is based, in part, on the metadata accessed in step 304. Examples of how metadata may be used to influence the selection of command codes for executing universal commands will be provided in more detail herein.

At step 308, remote control unit 104 executes the universal command by transmitting the selected one or more command codes from step 306 to CE device 108. In an embodiment, remote control unit 104 executes the universal command in response to user input. For example, the user may employ remote control unit 104 to activate the universal command, and, in response, remote control unit 104 transmits the selected one or more command codes via an IR link to CE device 108.

In an alternate embodiment, remote control unit 104 executes the universal command in response to reaching some predetermined time as programmed by the user (e.g., turn off all CE devices at 11:00 PM). In a still alternate embodiment, remote control unit 104 executes the universal command in response to a predetermined action or event as programmed by the user (e.g., in response to a TV being powered on). The concept of automatically executing universal commands in response to time or event triggers rather than user intervention is described in more detail in commonly-owned U.S. patent application Ser. No. To Be Determined (Attorney Docket No. 2100.0030004), entitled "Method, System and Computer Program Product for Automatically Managing Components within a Controlled Environment," to Krzyzanowski et al., filed concurrently herewith, the entirety of which is incorporated by reference as if fully set forth herein.

Steps 310 and 312 are optional steps by which the user may provide feedback concerning the predefined set of command codes accessed in step 302 and/or the metadata accessed in step 304. In particular, in optional step 310, remote control unit 104 receives user input related to one or more errors in the predefined set of command codes accessed in step 302 and/or the metadata accessed in step 304 and transmits the user input to a host or database manager of the database(s) accessed in step 302 and/or 304. In optional step 312, remote control unit 104 receives user input related to approval or disapproval of the predefined set of command codes accessed in step 302 and/or the metadata accessed in step 304 and transmits the user input to a host or database manager of the database(s) accessed in step 302 and/or 304.

Various aspects of the foregoing method steps will now be discussed in more detail.

1. Use of CE Device Metadata in Accordance with an Embodiment of the Present Invention A remote control unit in accordance with an embodiment of the present invention permits a user to execute a basic set of universal commands for controlling a variety of CE devices each having a different manufacturer and/or model type. As discussed elsewhere herein, this is achieved by utilizing CE device metadata to select one or more command codes from a predefined set of command codes for the CE device to implement a particular universal command. Metadata refers to data relating to certain control behaviors that are specific to a certain CE device type. Knowledge of these control idiosyncrasies is essential to achieving true automated control of CE devices. Examples of how metadata is used to influence the selection of command codes for executing universal commands are provided below.

a. Setting Input State Using CE Device Metadata

Proper response by certain conventional CE devices to a received command code, such as an IR command code, requires the CE device to be in the correct input mode or state. For example, if a user desires to watch a DVD movie on his or her TV, he or she can see whether the TV is set to the correct input state (e.g., VIDEO 1 for DVD input) and select the proper input state if the TV is not set to receive the DVD signals. This user intervention precludes fully automatic operation of the user's home entertainment system.

In this regard, a remote control unit could be pre-programmed to automatically execute a series of commands to enable the viewing of a movie on a DVD on a TV. Such a series of commands, however, would not function correctly unless the TV was either (i) already set to the appropriate input state for receiving DVD signals, or (ii) the remote control device could be programmed to set the TV to the proper video input state. The problem with the former condition is that a remote control unit cannot assume that the DVD input state has already been selected, and requires the user to set the TV to the proper input before executing the macro. The problem with the latter condition is that conventional remote control units have no practical means to select the proper video input state without knowledge of the input at which the TV is set at that moment.

An embodiment of the present invention takes advantage of CE device behavior metadata to facilitate full automatic or programistic control of CE devices. For example, an Aquos™ TV, manufactured by Sharp Corporation of Osaka, Japan, has the following video input state cycle: TV, AV1, and AV2. For the purposes of this example, AV1 is the input state that receives input from a digital satellite receiver and AV2 is the input state that receives input from a DVD player.

The Sharp Aquos™ TV defaults to the TV tuner state when it receives a channel up or channel down command from the remote control unit. This behavior idiosyncrasy of the Sharp Aquos™ TV represents a metadata that is included in a database and accessed by a remote control unit in accordance with an embodiment of the present invention. If the user desires to watch a DVD movie on a Sharp Aquos™ TV, he or she can, for example, activate a universal command to "power on" the DVD player. In response to that activation, the remote control unit references the meta-data for the Sharp Aquos™ TV, which informs the unit of the video input state cycle metadata described above. Accordingly, the remote control unit transmits a command code to turn on the DVD player, and then sends a "channel up" command code to the TV to set the TV's video input state to the TV tuner. Because the TV must now be in the first mode of the video input cycle, the remote control unit then transmits a command code to the TV to select the next input state in the cycle, AV1 (satellite TV), and then sends another command code to select the next input state to set the TV to AV2 (DVD player). Now that the TV has been properly set to receive input from the DVD player, the remote control unit can then transmit "play" and other commands to the DVD player.

In other words, in accordance with the foregoing example, a remote control device in accordance with an embodiment of the present invention will associate the universal command for "powering on" the DVD player with the following command codes for the Sharp Aquos™ TV based on the Aquos™ TV metadata: "channel up," "next input state," and "next input state."

Alternatively, the Sharp Aquos™ TV can also be set to the TV tuner input state by entering a channel number. This represents another metadata of the Aquos™ TV. For example, by issuing "0" and "3" channel commands (corresponding to channel 3), the Aquos™ TV will be set to the TV input state of the video input cycle regardless of what input mode the TV was in at that moment. With the TV set to a known mode, a remote control unit in accordance with the embodiment of the present invention can then issue appropriate commands to cycle through the video input cycle until it arrives at the desired input.

The example described above illustrates only one application of the present invention. Any application that requires a known input state of a CE device (e.g., stereo amplifiers) can benefit from the present invention. In accordance with an embodiment of the present invention, a database stores and organizes information that permits the remote control unit to set a CE device to a desired state without user intervention.

b. Tuning TV Channels Using CE Device Metadata

The idiosyncrasies of TV channel selection present another example of CE device metadata that can be stored and used in accordance with an embodiment of the present invention. For example, the Sharp Aquos™ TV provides a channel selection range of 1 to 999. To select channel 1, the user must input "0" and "1" into the Aquos™ remote control unit. If the user merely inputs "1", the TV will assume that the user intends to select a channel between 10 and 19, and will wait for the next digit. Similarly, to select channel 35, the user must input "3" and "5". However, to select any channel above 99, the user must first press the "100" button on the Aquos™ remote control unit. Thus, to select channel 160, the user must press "100" and then "6" and "0". If the user presses "1", "6" and "0" to tune to channel 160, the TV will actually tune to channel 16, and start the tuning process for a new channel between 1 and 9 (i.e., the TV will accept the final "0" input as a signal for another tuning selection and wait for the next digit to be entered).

Thus, in accordance with the present invention, a remote control unit accesses a database to obtain metadata regarding these channel-tuning rules of the Sharp Aquos™ TV. One exemplary application of this channel-tuning metadata would be programming a "Favorite Channel" key to correspond to channel 160. For example, if channel 160 was HBO®, the Favorite Channel key could be represented by the HBO® logo on the user interface of a remote control unit. Based on the metadata, the remote control unit would then associate the Favorite Channel key with the following AquoS™ TV command codes: the "100" key signal, the "6" key signal, and the "0" key signal. Consequently, when a user selects the Favorite Channel key, the remote control unit will first transmit the "100" key signal to the TV and then transmit signals corresponding to "6" and "0" in order to properly tune the TV to that particular selected channel.

Another example of the idiosyncrasies of TV channel selection is provided by TVs and devices that are capable of tuning TVs, such as satellite boxes, cable boxes, VCRs, and the like, that can accept varying numbers of digits for purposes of tuning directly to a channel. For example, some TV devices, such as the Sharp Linytron® TV, can accept only two digits to select a channel, thereby effectively limiting their tuning range to channels 1 through 99. Other devices, such as the TiVo® Series 2 Satellite Tuner, can accept four digits and thus are capable of tuning between channels 1 and 9999. Accordingly, a database in accordance with the present invention stores metadata relating to the maximum number of channel digits a TV device is capable of accepting. In accordance with the present invention, this type of tuning-channel metadata is stored in the database to ensure that the remote control unit does not attempt to tune the device to a channel that is out of its range (e.g., requesting a device tune to channel 555 when that device is only capable of tuning from channels 1 to 99).

A further example of the idiosyncrasies of TV channel selection is provided by certain TVs require an "Enter" or "Select" key to be activated in order to tune to a desired channel. For example, to select channel 2, some conventional CE devices require the user to press "0" and "2" and then "Enter" (or "Select") on a remote control unit. What is more, some TV devices only allow "Enter" or "Select" to be pressed when the user enters a number of digits corresponding to a selected channel that is less than the maximum number of channel digits that the TV device is capable of receiving. An example of this is a TiVo® Series 2 Satellite Tuner, which can accept up to four digits corresponding to a selected channel. Entering four digits results in this device immediately tuning the TV to the four-digital channel. Thus, to tune to channel 16, the user would press "0", "0", "1" and "6" on the remote control unit.

However, due to a command idiosyncrasy of the TiVo® Series 2 Satellite Tuner, the user may also achieve the same result without entering zeros. To tune to channels with less than four digits, the user need only enter the one, two, or three digits corresponding to the desired channel followed by the "Enter" key. For example, pressing "1", "6" and then pressing "Enter" also results in a successful direct tune to channel 16 for the TiVo® Series 2 Satellite Tuner. However, if the user uses the four-digit format to select a channel and also presses the "Enter" key, the tuner will change back to the last channel, which is erroneous behavior. A database in accordance with an embodiment of the present invention stores the foregoing types of tuning metadata to allow direct and proper tuning of devices requiring use of the Enter or Select key.

2. Interactive Database Access in Accordance with an Embodiment of the Present Invention In accordance with an embodiment of the present invention, user interface 208 of remote control unit 104 includes a dynamic graphical user interface (GUI) screen by which a user can access and navigate a remote database to acquire desired command codes and metadata and interactively communicate with the database. For example, the GUI may be generated by database server 118 and presented to the user on remote control unit 104. Alternately, the GUI may be generated locally by remote control unit 104. In other words, remote control unit 104 may be provided with the database contents and generate its own user interface rendering for access, control, and navigation.

Figure 4:
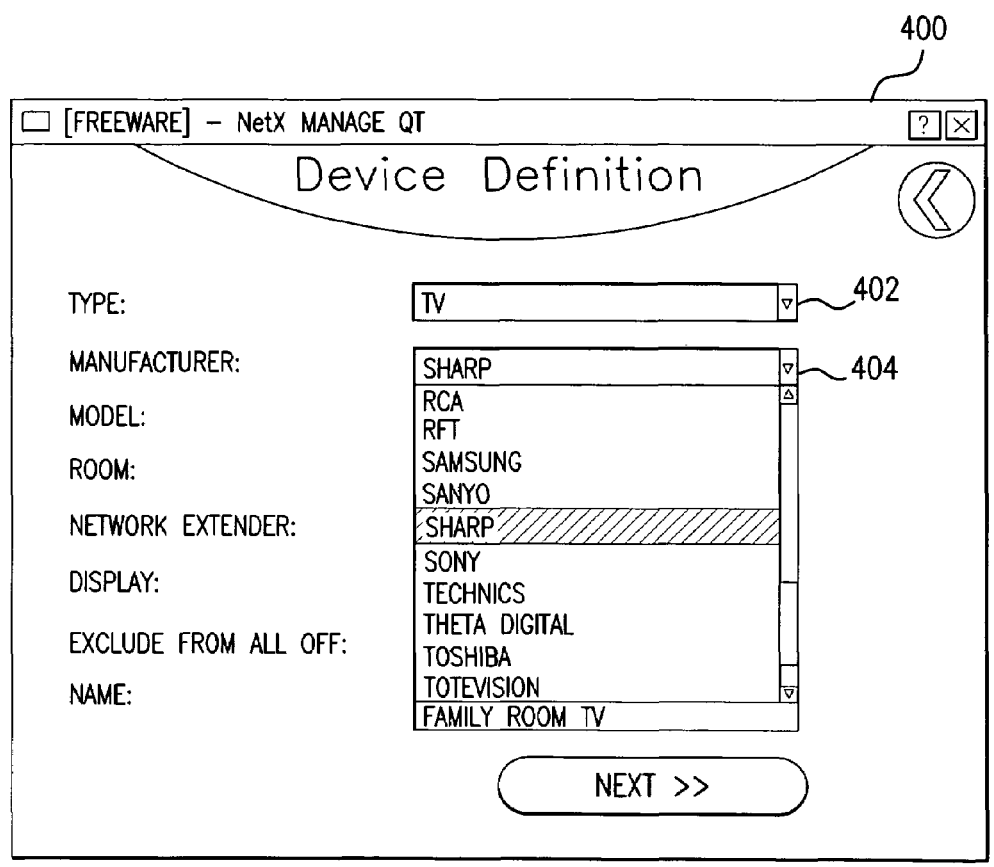
FIG. 4 illustrates an example graphical user interface (GUI) for accessing CE device metadata and/or IR command codes in accordance with an embodiment of the present invention.

For example, in an embodiment, a user accesses the appropriate set of command codes and metadata by using the GUI to specify the type of CE device in which the user is interested (e.g., television, VCR, CD player, DVD player, stereo receiver), the manufacturer of the CE device, and the model of the CE device. FIG. 4 illustrates an example GUI 400 for accessing CE device metadata and/or IR command codes in accordance with an embodiment of the present invention. More detail concerning the appearance and function of example GUI 400 and related user interface embodiments is provided in commonly-owned U.S. Patent Application Ser. No. To Be Determined (Attorney Docket No. 2100.0060001), entitled "User Interface for Multi-Device Control," to Killian et al., filed concurrently herewith, the entirety of which is incorporated by reference as if fully set forth herein.

As shown in FIG. 4, the example GUI 400 includes a drag and drop menu 402 for specifying the type of CE device from a list of known CE device types, and a drag and drop menu 404 for specifying the manufacturer of the CE device from a list of known manufacturers. As shown in FIG. 4, the user has identified the CE device of interest as a TV, and has selected the manufacturer as Sharp. In an embodiment, if the CE device manufacturer is not in the list of known manufacturers, the user is presented with the option of creating a new manufacturer.

After the user has selected the manufacturer of the CE device, the user then selects the model type of the CE device. FIG. 5 further illustrates example GUI 400, and in particular, depicts a drag and drop menu 502 for specifying the model of CE device from a list of known model types. As shown in FIG. 5, the user has identified the Sharp Aquos™ model type. In an embodiment, if the CE device model is not in the list of known models, the user is presented with the option of creating a new model.

Once the user has identified the CE device type, manufacturer and model of the CE device, remote control unit 104 requests a set of command codes and metadata for that CE device type from the database. In an embodiment, if the database has more than one data entry for the selected CE device type, the database returns multiple data entry results. For example, the user may be presented with a list of available and responsive data entry rows as shown in the example GUI 600 of FIG. 6. As shown in GUI 600, the database may reveal certain information about each entry, such as approval or disapproval of the entry by other users, to assist the user in selecting one of the entries. The user then selects one of the available entries to download to remote control unit 104, such as the entry with a 98% user-approval rating.

FIG. 7 depicts an example of IR command code data 700 that is downloaded from the database to the remote control unit in accordance with an embodiment of the present invention. In FIG. 7, the IR command code data is depicted in a GUI 702 associated with the NotepadX application of Microsoft Windows®.

3. Interactive Database Feedback in Accordance with an Embodiment of the Present Invention In accordance with an embodiment of the present invention, the centralized database that stores CE device command codes and metadata is created and maintained by a host or database manager to allow users to download data to expand and update their personal IR code databases used by their remote control units. The host creates the database by populating the database grid with appropriate data.

The master database, however, may include erroneous data. Errors can be inadvertently introduced into the database by including faulty command codes or by entering valid command codes incorrectly. A reliable way to detect these data errors is through empirical evidence, such as observing that a certain set of command codes does not properly control the CE device in question. However, the database host is not well-suited to test all of the database codes, which can easily number in the tens of thousands, to verify that they are valid and correct.

In accordance with an embodiment of the present invention, a central database (such as databases 120 and 122 and associated database server of FIG. 1), relies on data error and correction input received through interactive communication with users. For example, an embodiment of the present invention permits the validity of command codes and metadata stored in the database to be verified or challenged by end users who have used data that has been downloaded from the database. A user who has observed that a database entry is not valid can provide such input to the host via a database user interface. Upon being alerted to such feedback from the user, the host can then verify the data entry problem and substitute the correct command codes or metadata into the database.

For example, after using command codes and metadata downloaded from the database, a user can approve or disapprove of the database entry. FIG. 8 illustrates an example GUI 800 for providing user input relating to approval or disapproval of CE device metadata and/or IR command codes in accordance with an embodiment of the present invention. This user-approval rating information is then recorded and compiled into the database for use by other users.

In accordance with an embodiment of the present invention, the user can also propose modifications to a data entry if it is found to be erroneous, including submitting corrected data to the database server. FIG. 9 illustrates an example GUI 900 for providing user input relating to the correction of one or more errors in CE device metadata and/or IR command codes in accordance with an embodiment of the present invention. In accordance with a further embodiment of the present invention, a process can be implemented whereby a user can offer additional command codes for inclusion into the database subject to acceptance thereof by the host.

C. Alternate Device Control System Using Local PC/Server In Accordance with an Embodiment of the Present Invention As discussed herein, an embodiment of the present invention obviates the steps required by conventional systems for setting up a physical link between a remote control unit and a database for accessing CE device command codes. For example, in accordance with an embodiment of the present invention, a remote control unit can create an immediate link to a centrally located master IR code database. In the embodiment described in reference to FIG. 1, the user's remote control unit includes a wireless network interface, such as a plug-in or built-in WiFi network card for IEEE 802.11b Ethernet, that permits the remote control to wirelessly access a remotely hosted database that includes CE device command codes and metadata over a wide area network, such as the Internet.

FIG. 10 depicts the elements of an alternate device control system 1000 in accordance with an embodiment of the present invention in which a database of CE device command codes and metadata 1008 is stored locally on a local PC/server 1006 for access by a remote control unit 1002 via a wireless access point 1004. In an embodiment, local PC/server 1006 comprises a centralized control server such as is described in commonly owned and co-pending U.S. patent application Ser. No. 10/180,500, entitled "Method, System, and Computer Program Product for Managing Controlled Residential or Non-residential Environments," the entirety of which is incorporated by reference herein.

In accordance with system 1000, remote control unit 1002 establishes wireless connectivity to local PC/server 1006 via a wireless local area network, or intranet, to download CE device command codes and metadata from local database 1008. Thus, in this embodiment, method steps 302 and 304 described above in reference to FIG. 3 are performed between remote control unit 1002 and local PC/server 1006. In a further embodiment, remote control unit 1002 operates as a "thin client," merely providing a user interface between a user and local PC/server 1006 and communicates with the PC/server 1002 on a continuous real time basis for control data. In this embodiment, local PC/server also performs method step 306 described above in reference to FIG. 3.

In accordance with a further embodiment, local PC/server 1006 can periodically update the CE device command codes and metadata stored in local database 1008 by accessing remote databases 120 and 122 via Internet 116.

The wireless connectivity described above in reference to both system 100 of FIG. 1 and system 1000 of FIG. 10 enables a remote control unit to have instantaneous and wireless connectivity to a database that includes CE device command codes and metadata. As a result, a user does not have to perform steps necessary to create a hard physical connection to the database as in conventional systems. Rather, if the user desires to update the remote control unit, he or she need only use the remote control unit to call up the master database via a wide or local area network and directly download desired data from the database.

D. Conclusion

While various embodiments of the present invention have been described above, it should be understood that they have been presented by way of example only, and not limitation. It will be understood by those skilled in the relevant art(s) that various changes in form and details may be made therein without departing from the spirit and scope of the invention as defined in the appended claims. Accordingly, the breadth and scope of the present invention should not be limited by any of the above-described exemplary embodiments, but should be defined only in accordance with the following claims and their equivalents.

What is claimed is:

1. An automated method for programmed control of a consumer electronic device, comprising:

accessing a database that stores metadata that specifies unique requirements for controlling the consumer electronic device, wherein said unique requirements for controlling the consumer electronic device include at least one of: device activation requirements, tuning requirements, and input state selection requirements;

associating a universal command for controlling consumer electronic devices with one or more command codes selected from a predefined set of command codes for the consumer electronic device, wherein said one or more command codes are selected based on said metadata; and executing said universal command, wherein executing said universal command comprises transmitting said one or more command codes to the consumer electronic device.

2. The method of claim 1, wherein said executing said universal command comprises executing said universal command in response to user input.

3. The method of claim 1, wherein said executing said universal command comprises executing said universal command in response to reaching a predetermined time.

4. The method of claim 1, wherein said executing said universal command comprises executing said universal command in response to a predetermined event or action.

5. The method of claim 1, wherein said accessing said database that stores metadata comprises wirelessly accessing said database that stores said metadata.

6. The method of claim 5, wherein said wirelessly accessing said database comprises establishing a wireless connection with a local area network.

7. The method of claim 5, wherein said wirelessly accessing said database comprises establishing a wireless connection with a wide area network.

8. The method of claim 5, wherein said wirelessly accessing said database comprises performing wireless communication in accordance with an IEEE 802.11 protocol.

9. The method of claim 5, further comprising:
transmitting user input related to one or more errors in said metadata to a host that maintains said database via a database user interface.

10. The method of claim 5, further comprising:
transmitting user input related to approval or disapproval of said metadata to a host that maintains said database via a database user interface.

11. The method of claim 1, further comprising:
accessing said predefined set of command codes for the consumer electronic device.

12. The method of claim 11, wherein said accessing said predefined set of command codes comprises wirelessly accessing a database that stores said predefined set of command codes.

13. The method of claim 12, further comprising:
transmitting user input related to one or more errors in said predefined set of command codes to a host that maintains said database that stores said predefined set of command codes via a database user interface.

14. The method of claim 12, further comprising:
transmitting user input related to approval or disapproval of said predefined set of command codes to a host that maintains said database that stores said predefined set of command codes via a database user interface.

15. An apparatus for controlling a consumer electronic device, comprising:
a network interface;
a transmitter;
a user interface; and
control logic coupled to said network interface, said transmitter, and said user interface;
wherein said control logic is adapted to access a database that stores metadata that specifies unique requirements for controlling the consumer electronic device via said network interface, wherein said unique requirements for controlling the consumer electronic device include at least one of device activation requirements, tuning requirements, and input state selection requirements, to associate a universal command for controlling consumer electronic devices with one or more command codes selected from a predefined set of command codes for the consumer electronic device, wherein said one or more command codes are selected based on said metadata, and to execute said universal command in response to user input received via said user interface, wherein executing said universal command comprises transmitting said one or more command codes to the consumer electronic device via said transmitter.

16. The apparatus of claim 15, wherein said transmitter comprises an infrared (IR) transmitter.

17. The apparatus of claim 15, wherein said transmitter comprises a transmitter adapted for wireless communication in accordance with an IEEE 802.11 protocol.

18. The apparatus of claim 15, wherein said network interface device comprises a wireless transceiver.

19. The apparatus of claim 18, wherein said wireless transceiver comprises a wireless transceiver adapted for wireless communication in accordance with an IEEE 802.11 protocol.

20. The apparatus of claim 15, further comprising:
a memory;
wherein said memory stores said universal command, said metadata, and said predefined set of command codes.

21. The apparatus of claim 15, wherein said control logic is adapted to access said database that stores said metadata via said network interface.

22. The apparatus of claim 21, wherein said user interface comprises:
a database user interface adapted to receive user input related to one or more errors in said metadata;
wherein said control logic is further adapted to transmit said user input to a host that maintains said database via said network interface.

23. The apparatus of claim 21, wherein said user interface comprises:
a database user interface adapted to receive user input related to approval or disapproval of said metadata;
wherein said control logic is further adapted to transmit said user input to a host that maintains said database via said network interface.

24. The apparatus of claim 15; wherein said control logic is further adapted to access said predefined set of command codes via said network interface.

25. The apparatus of claim 24, wherein said control logic is adapted to access a database that stores said predefined set of command codes via said network interface.

26. The apparatus of claim 25, wherein said user interface comprises:
a database user interface adapted to receive user input related to one or more errors in said predefined set of command codes;
wherein said control logic is further adapted to transmit said user input to a host that maintains said database that stores said predefined set of command codes via said network interface.

27. The apparatus of claim 25, wherein said user interface comprises:
a database user interface adapted to receive user input related to approval or disapproval of said predefined set of command codes;
wherein said control logic is further adapted to transmit said user input to a host that maintains said database that stores said predefined set of command codes via said network interface.

28. A system, comprising:
a consumer electronic device;
a server, said server including a database that stores a predefined set of command codes for said consumer electronic device and metadata that specifies unique requirements for controlling said consumer electronic device, wherein said unique requirements for controlling said consumer electronic device include at least one of device activation requirements, tuning requirements, and input state selection requirements; and
a remote control unit communicatively connected to said consumer electronic device and to said server via a network;
wherein said remote control unit is adapted to receive said predefined set of command codes and said metadata from said server, to associate a universal command for controlling consumer electronic devices with one or more command codes selected from said predefined set of command codes for said consumer electronic device, wherein said one or more command codes are selected based on said metadata, and to execute said universal command in response to user input, wherein executing said universal command comprises transmitting said one or more command codes to said consumer electronic device.

29. The system of claim 28, wherein said remote control unit is communicatively connected to said consumer electronic device via an infrared (IR) link.

30. The system of claim 28, wherein said remote control unit is communicatively connected to said consumer electronic device via an IEEE 802.11 link.

31. The system of claim 28, wherein said consumer electronic device comprises one of a television, a video cassette recorder, a digital video disc player, a personal video recorder, a compact disc player, a stereo receiver, an electronic thermostat, a lamp, or a video camera.

32. The system of claim 28, wherein said remote control unit comprises one of a personal digital assistant or a web-pad.

33. The system of claim 28, wherein said remote control unit is further adapted to establish a wireless connection with said network.

34. The system of claim 33, wherein said remote control unit is adapted to establish a wireless connection with said network in accordance with an IEEE 802.11 protocol.

35. The system of claim 28, wherein said network comprises a local area network.

36. The system of claim 28, wherein said network comprises a wide area network.

37. The system of claim 28, wherein said remote control unit is further adapted to receive user input related to one or more errors in said metadata and to transmit said user input to said server.

38. The system of claim 28, wherein said remote control unit is further adapted to receiver user input related to approval or disapproval of said metadata and to transmit said user input to said server.

39. The system of claim 28, wherein said remote control unit is further adapted to receive user input related to one or more errors in said predefined set of command codes and to transmit said user input to said server.

40. The system of claim 28, wherein said remote control unit is further adapted to receive user input related to approval or disapproval of said predefined set of command codes and to transmit said user input to said server.

41. A system, comprising:
a consumer electronic device; and
a remote control unit communicatively coupled to said consumer electronic device, said remote control unit including a database that stores a predefined set of command codes for said consumer electronic device and metadata that specifies unique requirements for controlling said consumer electronic device, wherein said unique requirements for controlling said consumer electronic device include at least one of device activation requirements, tuning requirements, and input state selection requirements;

wherein said remote control unit is adapted to receive said predefined set of command codes and said metadata from said database, to associate a universal command for controlling consumer electronic devices with one or more command codes selected from said predefined set of command codes for said consumer electronic device, wherein said one or more command codes are selected based on said metadata, and to execute said universal command in response to user input, wherein executing said universal command comprises transmitting said one or more command codes to said consumer electronic device.

42. The system of claim 41, wherein said remote control unit is communicatively connected to said consumer electronic device via an infrared (IR) link.

43. The system of claim 41, wherein said remote control unit is communicatively connected to said consumer electronic device via an IEEE 802.11 link.

44. The system of claim 41, wherein said consumer electronic device comprises one of a television, a video cassette recorder, a digital video disc player, a personal video recorder, a compact disc player, a stereo receiver, an electronic thermostat, a lamp, or a video camera.

45. The system of claim 41, wherein said remote control unit comprises one of a personal digital assistant or a web-pad.

46. A database for facilitating control of a consumer electronic device, the database comprising:

a predefined set of command codes for the consumer electronic device; and metadata that specifies unique requirements for controlling the consumer electronic device, wherein the unique requirements for controlling the consumer electronic device include at least one of device activation requirements, tuning requirements, and input state selection requirements.

47. The database of claim 46, wherein said predefined set of command codes for the consumer electronic device comprises a predefined set of infrared (IR) command codes.

48. The database of claim 46, further comprising:

one or more additional predefined sets of command codes for the consumer electronic device.

49. The database of claim 46, further comprising:

one or more additional metadata related to unique control behaviors of the consumer electronic device.

* * * * *